United States Patent [19]
Radford et al.

[11] Patent Number: 6,118,670
[45] Date of Patent: Sep. 12, 2000

[54] PCB MOUNTING ARRANGEMENT FOR TWO COMPONENTS REQUIRING HIGH-SPEED CONNECTIONS TO A THIRD COMPONENT

[75] Inventors: Susan K. Radford; Heather L. Volesky, both of Fort Collin, Colo.

[73] Assignee: Hewlett-Packard Company, Palo Alto, Calif.

[21] Appl. No.: 09/107,662

[22] Filed: Jun. 30, 1998

[51] Int. Cl.$^7$ ........................................................ H05K 7/02
[52] U.S. Cl. ........................... 361/777; 361/783; 174/261; 257/723; 257/786
[58] Field of Search ................................... 361/777, 783; 257/723, 724, 777, 786; 174/261, 260

[56] References Cited

U.S. PATENT DOCUMENTS

| | | | |
|---|---|---|---|
| 4,868,634 | 9/1989 | Ishida et al. | 257/723 |
| 5,959,845 | 9/1999 | Faucher | 361/777 |
| 6,051,886 | 4/2000 | Fogal et al. | 257/786 |

*Primary Examiner*—Jeffrey Gaffin
*Assistant Examiner*—John B. Vigushin
*Attorney, Agent, or Firm*—Kevin M. Hart

[57] ABSTRACT

Printed circuit board has first, second and third sets of connection points operable to connects to first, second and third integrated circuits. Each set of connection points is arranged in a grid pattern having a center pairs of orthogonal axes intersect. The grids define parallel planes. The pairs of orthogonal axes of the second grid are rotated counterclockwise relative to those of the first grid by at least 5 but not more than 25 degrees. Signal connection points in the first and second grids are concentrated in corners closet to the center of the third grid. Signal connection points in the third grid are concentrated in the half closest to the centers of the first and second grids. Alternatively, when signal connection points are concentrated elsewhere in the grid, the pairs of axes for the second grid are rotated relative to those of the first by an amount other than 0, 45, 90, 135, 180, 225, 270 and 315 degrees. First and second sets of mounting holes attach first and second heat dissipators. The second set of mounting holes is rotated relative to the first by either 0, 90, 180 or 270 degrees. First conductive traces connect signal connection points in the third grid to signal connection points in the grid. Second conductive traces connect the signal connection points in the grid to signal connection points in the second grid. The aggregate conductive paths, formed from die to die by the first and second sets of conductive traces and the corresponding conductors internal to the chip packages, all have the same length.

27 Claims, 3 Drawing Sheets

PCB MOUNTING ARRANGEMENT FOR TWO COMPONENTS REQUIRING HIGH-SPEED CONNECTIONS TO A THIRD COMPONENT

SUMMARY OF THE INVENTION

The invention relates to printed circuit board mounting arrangements for high-speed digital components that require high-speed connections to one another.

BACKGROUND

Designers of printed circuit boards ("PCBs") for modern digital systems face an ever-present demand for increase component density and trace density. Moreover, as device fabrication technology has advanced, the intended operating speeds for digital components have also steadily increased, resulting in PCB mounting requirements that often conflict with one another. On the one hand, increased operating speeds mean higher heat generation per component, which is a factor that militates for placing components at a larger distance from one another in order to ease the problem of heat dissipation. But on the hand, higher operating speeds also usually result in a speed to place components closer together in order to shorten the lengths of the traces that carry high-speed signals between them.

These problems become particularly troublesome in the context of mounting multiple indentical processors on the same PCB and coupling of each of the processors to a single secondary component such as a bus interface device. First, processor chips are among the highest heat generating devices in a digital system because of their high operating speeds. Second, PCB traces begin to operate like waveguides when carrying high-frequency digital signals; therfore, not only should they be as short as possible, but even their topologies become important design constraints. Third, each integrated circuit package contains internal conductors that connect the die to the external chip pads. When multiple processors are to be connected to a single bus interface device to form high-speed bus, the aggregate length of each conductive path from die to die should be the same, including the lengths of the internal conductors as well as the lenghts of the external PCB traces.

It is therefore an object of the invention to provide a high-speed component PCB mounting arrangement that strikes a uniquely advantageous balance between component proximity, trace length and trace length symmetry.

It is further object of the invention to provide such a uniquely advantageous PCB mounting arrangements for multiple identical processes and a single secondary component such as a bus interface device, wherein the multiple indentical processors and the secondary component must be coupled together to form a high-speed bus.

SUMMARY OF THE INVENTION

In one aspect, the invention includes a printed circuit board having first, second and third sets of connection points operable to be electrically connected to first, second and third integrated circuits, respectively. The connection points in each of the sets of connection points are arranged in a grid pattern having a center at which pairs of orthogonal axes intersect. The grids define parallel planes, and the pairs of orthogonal axes corresponding to the first and seconds grids are rotated counterclockwise relative to one another by at least 5 degrees but not more than 25 degrees. In preferred embodiments, the axes are rotated counterclockwise relative to one another by approximately 15 degrees. The signal connections points in the first and second grids are concentrated in the corners closest to the center of the grid, and the signal connection points in the third grid are concentrated in the half closest to the centers of the first and second grids. In an alternative preferred embodiment in which the signal connection points are located or concentrated elsewhere in the grids, the pair of axes corresponding to the first and second grids are rotated relative to one another by an amount other than 0 degrees, 45 degrees, 90 degrees, 135 degrees, 180 degrees, 225 degrees, 270 degrees, and 315 degrees.

In another aspect, the invention includes first and second sets of mounting holes operable to engage first and second heat dissipation assemblies, respectively. The first and second sets of mounting holes are positioned relative to the first and second grids so that the heat dissipation assemblies will operable to dissipate heat from the first and second integrated circuits when the integrated circuits and heat dissipation assemblies are installed on the printed circuit board. The second set of mounting holes is relative to the first set of mounting holes by either approximately 0 degrees, approximately 90 degrees. approximately 180 degrees, or approximately 270 degrees.

In yet a further aspect, the invention includes a first set of conductive traces connecting a third set of signal connection points in the grid to a first set of signal connection points in the first grid, and a second set of conductive traces connecting the third set of signal connection points to a second of signal connection points in the second grid. Each of the first, and the third integrated circuits contains a die, as well as internal conductors connecting the die to the integrated circuit's external signal connection points. The external conductive traces in the first and second sets of conductive traces, when connected to the corresponding internal conductors within each integrated circuit, from a number of aggregate conductive paths. Each of these aggregate conductive paths approximately the same length. In a preferred embodiment, each of the aggregate conductive paths is less than approximately 2.5 inches long.

The angular offset mounting arrangement of the invention yields uniquely beneficial advantages when the first and second integrated circuits are heat-generating components such as microprocessors. The first and second integrated circuits may be positioned close enough to one another on the printed circuit board to enable trace lengths to be short, and yet far enough away from one another to enable adequate heat dissipation by the heat dissipation assemblies. Further benefits and advantages will become apparent with reference to the drawings and the accompanying detailed description provided below.

DETAILED DESCRIPTION OF THE PREFERRED EMBODIMENTS

Figure 1:
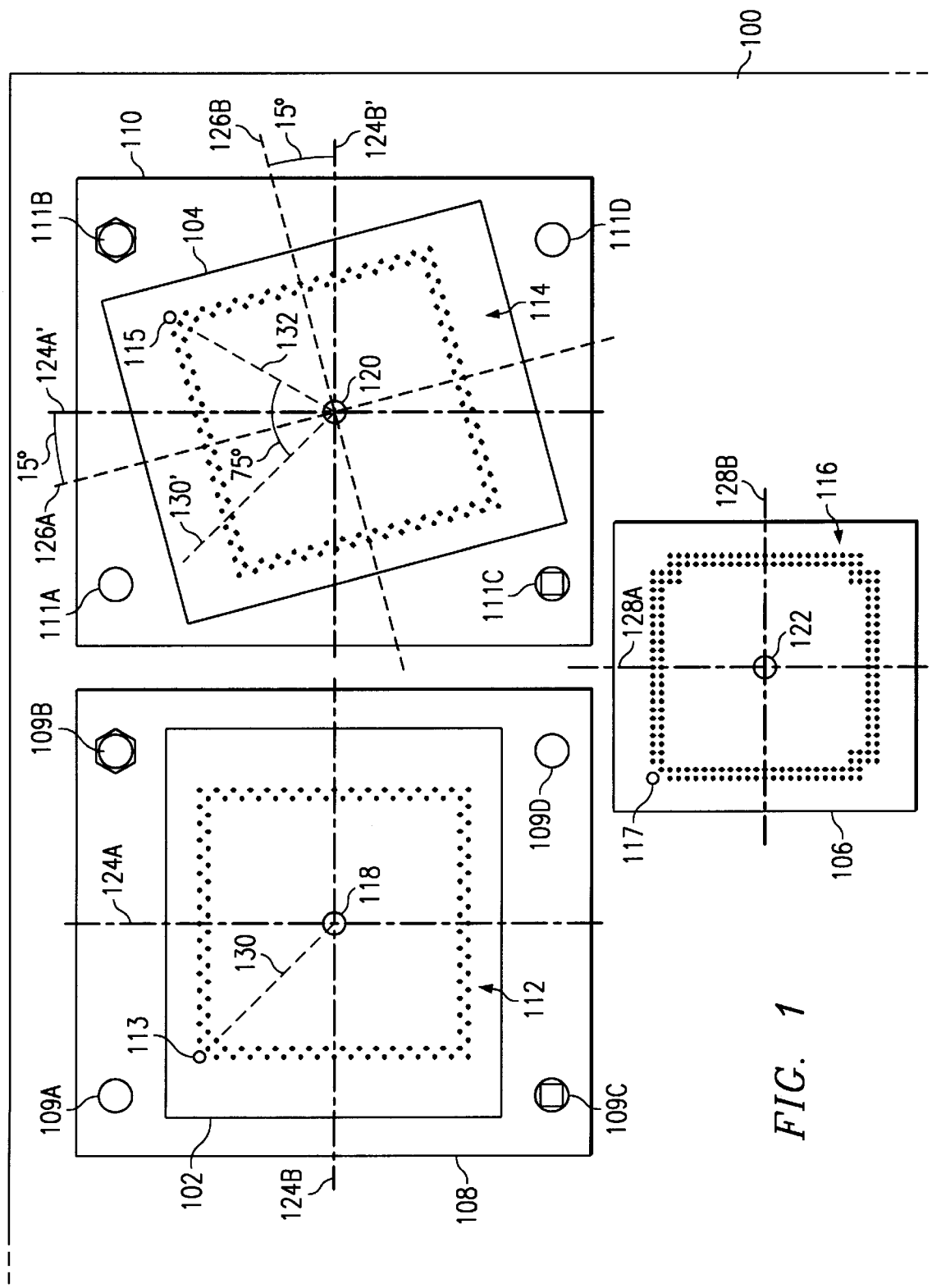
FIG. 1 is a top of printed circuit board having first, second and third integrated circuits mounted thereon according to a preferred embodiment of the invention.

FIG. 1 is a top view of a printed circuit board 100 having a first integrated circuit 102, a second integrated circuit 104 and a third integrated circuit 106 mounted thereon according to a preferred embodiment of the invention. A first heat dissipation assembly 108 is mounted over integrated circuit 102, and a second heat dissipation assembly 110 is mounted over integrated circuit 104. A first set of mounting holes 109 A–D is provided on printed circuit board 100 in order to attach heat dissipation assembly 108. A second set of mounting holes 111A–D is provided on print circuit board 100 in order to attach heat dissipation assembly 110.

Underneath integrated circuits 102, 104, and 106 are first, second and third sets of connection points 112, 114 and 116. Connection points 112, 114 and 116 may be formed on printed circuit board 100 by any conventional means. For example, they may be electrically conductive pads or plated-through holes. The number and arrangements of connection points shown in the drawing is for illustration purposes only. It is contemplated that the number and arrangement of connection points will vary depending upon the pin-outs of the various integrated circuits that will be mounted on printed circuit board 100. In a preferred embodiment, the connection points in sets 112, 114 and 116 will form a generally rectangular grid pattern defined by the edges of sets 112, 114 and 116 and centers 118, 120 and 122. (The word "rectangular" is used herein to include patterns that are perfectly square, as well as those that are that not perfectly square.) In a preferred embodiment, integrated circuits 102 and 104 are identical microprocessors, and integrated circuit 106 is ether a bus interface, a memory interface, an input/ outout interface, or a combination of those systems. In such a case, the connection points in sets 112, 114 and 116 will likely fill the rectangular patterns that are suggested in the drawing. The connection points corresponding to pin 1 of each of integrated circuits 102, 104 and 106 are indicated in the drawing at 113, 115 and 117, respectively. Grid 112, 114 and 116 define first, second and third planes, respectively. Preferably, these three planes will at least be parallel to one another. In the preferred embodiment, they are coplanar with one another. (Printed circuit board 100 may have multiple layers of conductive traces formed thereon and therein. Therefore, it is possible that grid patterns 112, 114 and 116 might lie on different parallel planes; but it is contemplated that grid patterns 112, 114 and 116 would lie on top of printed circuit board 100, on the same plane.)

The challenge posed in the preferred embodiment was that microprocessors 102 and 104 generated quite a bit of heat, and therfore could be placed too close together. On the other hand, each of them required a high-speed signal bus connection to integrated circuit 106. (In other preferred embodiment, signal were responsive to both edges of a 125 MHz clock, and were thus capable of toggling at 250 MHz.) Therefore, the three chips could not be mounted a large distance apart from one another either. In the preferred embodiment, centers 118,and 120 are at least two inches apart, but not more than four inches apart. Preferably, centers 118 and 120 are approximately 3 inches apart. Center 122 is disposed slightly closer to center 120 than it is to center 118. Preferably, center 122 is approximately 2.9 inches from center 120, and approximately 3.0 inches form center 118.

In order to discuss the angular orientation of connection point sets 112, 114 and 116, reference will now be made to several sets of orthogonal axes and lines of orientation. Grid pattern 112 has a set of orthogonal axes 124A–B. Orthogonal axes 124A–B are also shown in the drawing transposed to position 124A'–B'. A line 130 may be drawn from connection point 113 of grid 112 to center 118. Line 130 is also shown in the drawing transposed to position to 130'.

Grid pattern 114 has a set of orthogonal axes 126A–B. A line 132 may be drawn from connection point 115 of grid 114 to center 120. Grid 116 has a set of orthogonal axes 128A–B, as shown.

The inventors have discovered that, by rotating one of the three grid patterns 112, 114 and 116 a small amount relative to others, important advantages are achieved: Traces lengths between grid patterns 112, 114 and 116 may be shortened (to be discussed in further detailed below), while integrated circuits 102, 104 and 106 may be placed far enough apart from one another to achieve adequate mounting space and efficiency for heat dissipation assemblies 108 and 110. Specially, orthogonal axes 126A–B are rotated counter-clockwise relative to orthogonal axes 124A–B by approximately 15 degrees. It is contemplated that in other preferred embodiments this rotation may be reduced to as little as 5 degrees or increased to as much as 25 degrees without losing the advantages achieved by the angular offset. It is also contemplated that such an offset will yield advantages whether or not integrated circuits 102 and 104 are identical, and regardless of the location of the first pins of integrated circuits 102 and 104. However, in the preferred embodiment in which integrated circuits 102 and 104 are identical, line 132 is rotated clockwise about center 120 by approximately 75 degrees relative to line 130. It is contemplated that in other embodiment the latter amount of rotation may be decreased to as much as 65 degrees or increased to as much as 85 degrees without losing the advantages achieved by the angular offset. Note that orthogonal axes 128A–B are approximately parallel with orthogonal axes 124A–B.

In the preferred embodiment, heat dissipation assemblies 108 and 110 are mounted orthogonally relative to one anther, than at an angular offset to one another. In the drawing, heat dissipation assemblies 108 and 110 are mounted in the same orientation relative to one another (in other words, they are mounted at an angular offset of 0 degrees relative to one another). Heat dissipation assemblies 108 and 110 may also be mounted at a 180 degree angular offset relative to one another by rotating one of mounting holes 180 degrees relative to the other. If the footprint of heat dissipation assemblies 108 and 110 will allow it (for example, if they are square), they may be mounted at a 90 degree or a 270 degree angular offset to one another by rotating the mounting holes accordingly. It is believed that mounting heat dissipation assemblies 108 and 110 in any of the orthogonal arrangements just described (0, 90, 180, or 270 degrees offsets) will yield the best advantage in terms of proximity for integrated circuits 102, 104 and 106 and heat dissipation for integrated circuits 102 and 104.

Figure 2:
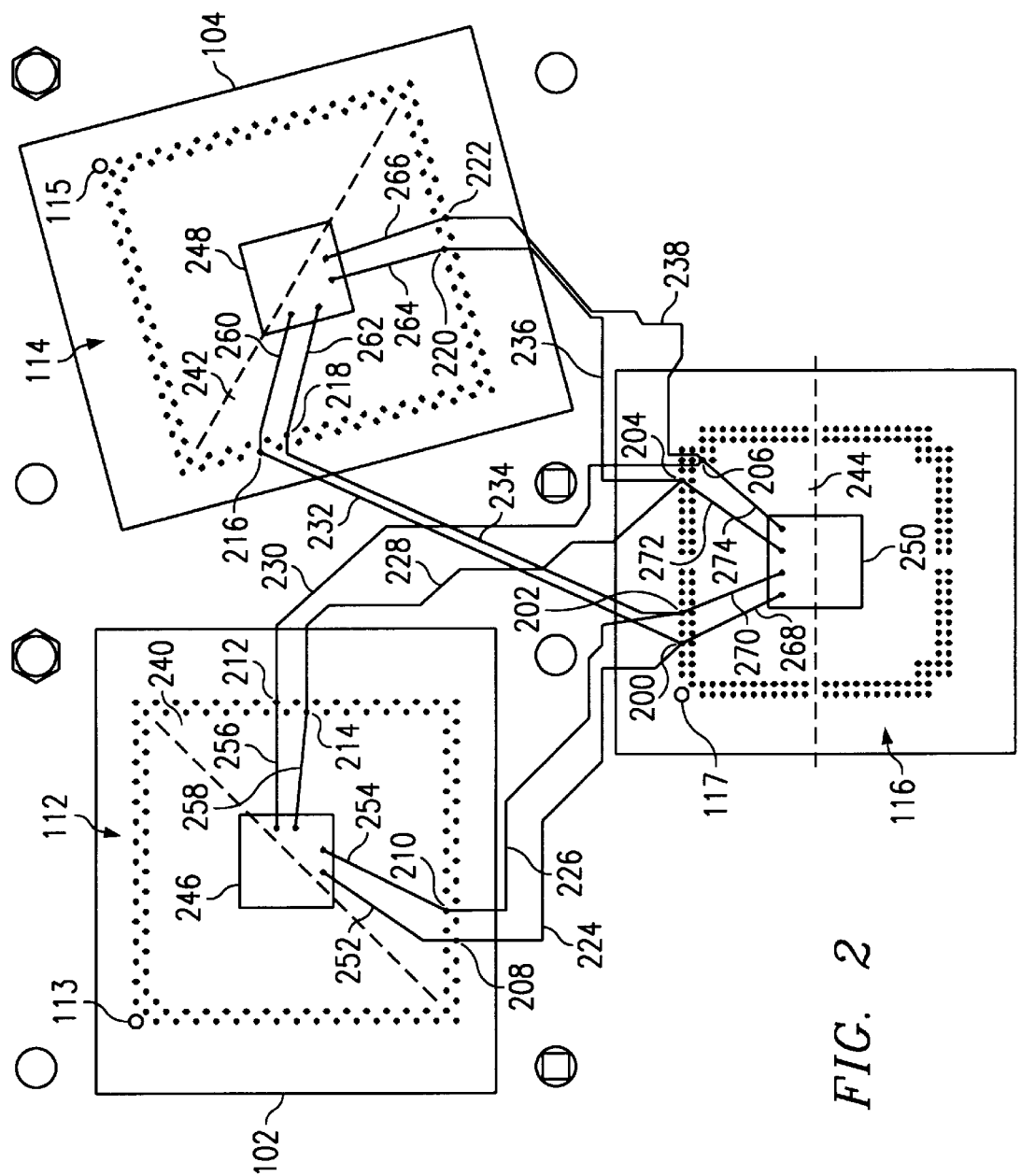
FIG. 2 is a top view of the printed circuit board of FIG. 1 illustrating a representative number of conductive traces routed thereon according to a preferred embodiment of the invention.

FIG. 2 is provided to illustrate the routing of conductive traces between grids 112, 114 and 116 in a preferred embodiment of printed circuit board 100. The orientation lines of FIG. 1, as well as the lines corresponding to heat dissipation units 108 and 110, have been removed from FIG. 2 in order not to obscure the illustration of the conductive traces. In FIG. 2, a first set of signal connection points 208, 210, 212 and 214 is identified in grid 112. A second set of signal connection points 216, 218, 220 and 222 is identified in grid 114. And a third set of signal connection points 200, 202, 204 and 206 is identified in grid 116. The number of signal connection points identified in each grid in the drawing is intentionally small in order not to obscure the drawing. The signal connection points shown are intended to be merely representative of signal connection points that would correspond to a bus. For example, in a preferred embodiment wherein integrated circuits 102 and 104 are microprocessors and integrated circuit 106 is a bus interface system, perhaps 64 address/data lines would be present with perhaps an additional two dozens or so control and parity lines.

Note that the signal connection points identified in the drawing are intended to represent the points at which the signals become accessible external to the chip package. Within each of the packages of integrated circuits 102, 104 and 106 will be a die, as indicated at 246, 248 and 250. Conductors internal to the chip packages connect each of the signal connection points to the die at the appropriate location. For example, conductors 252, 254, 256 and 258 connect die 246 to signal connection points 208, 210 212 and 214. Conductors 260, 262, 264 and 266 connect die 248 to signal connection points 216, 218, 220 and 222. And conductors 268, 270 272 and 274 connect die 250 to signal connection points 200, 202, 204 and 206. These internal conductors have lengths that should not be disregarded when designing the conductive traces formed on the PCB. Ideally, every conduction path in the bus should be equal when measured from die to die including the lenghts of the internal conductors as well as the external conductors.

In the representative embodiment shown, signal connection points 208 and 216 are connected to signal connection point 200 by conductive traces 224 and 232, respectively. Similarly, signal connection points 210 and 218 are connected to signal connection point 202 by conductive traces 226 and 234, respectively. Signal connection points 214 and 220 are connected to signal connection point 204 by conductive traces 228 and 236, respectively. And signal connection points 212 and 222 are connected to signal connection point 206 by conductive traces 230 and 238, respectively. The angular offset of grid 114, as well as the fact that center 122 is slightly closer to center 120 than to center 118, enables the twin goals of equal overall conductive path lengths and short external conductive trace lenghts to be achieved. In preferred embodiment in which the speed of the signals communicated on traces 224–238 can be as high as 250 MHz, the aggregate conductive path formed by traces 224–238 and corresponding internal conductors that couple the signal pins to the dies, are each less than 2.5 inches in length.

It is believed that an angular offset for grid 114 of between 5 and 25 degrees will be particularly beneficial in this regard when the signal connection points of integrated circuits 102 and 104 that must be connected to grid 116 are concentrated in corners 240 and 242, respectively, and when the corresponding signal connection points in grid 116 are concentrated in half 244, as shown. In other embodiments wherein the signal connection points of integrated circuits 102, 104 and 106 are located or concentrated in other places within grids 112, 114 and 116, it is believed that an angular offset for grids 112 and 114 beyond the range of between 5 and 25 degrees would be advantageous. However, in such embodiments, the following angular offsets for grids 112 and 114 should be avoided: 0 degrees, 45 degrees, 90 degrees, 135 degrees, 180 degrees, 225 degrees, 270 degrees, and 315 degrees. The reason for avoiding these angular offsets for grids 112 and 114 is that 0 degrees offset (and multiple of 90 degrees therefrom) inhibit achieving the goal of providing short trace lengths to grid 116, and 45 degree offsets (and multiples of 90 degrees therefrom) prevent integrated circuits 102 from being placed close together. Moreover, such offsets impede the ability to mount heat dissipation assemblies 108 and 110 in a manner that will provide satisfactory heat dissipation for integrated circuits 102 and 104.

Figure 3:
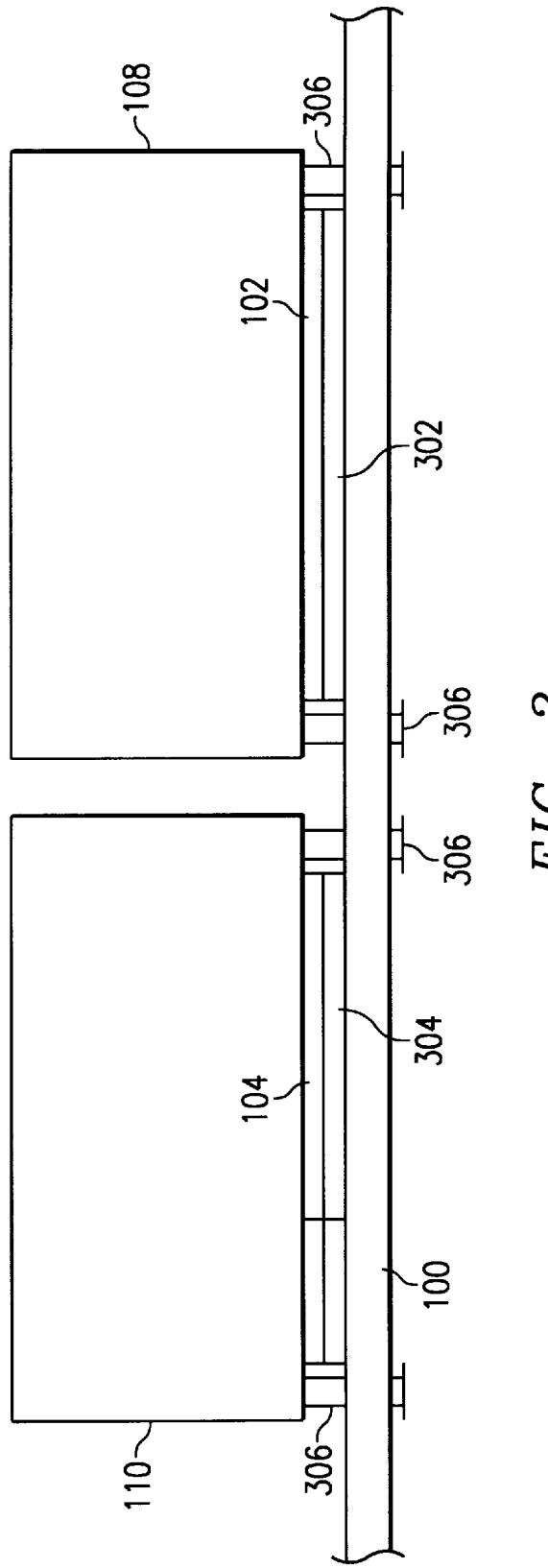
FIG. 3 is a side view of the printed circuit board of FIG. 1 illustrating first and second heat dissipation assemblies mounted thereon according to a preferred embodiment of the invention.

FIG. 3 is shows a side view of printed board 100 with integrated circuits 102 and 104 mounted thereon. In drawing, integrated circuits 102 and 104 are coupled to printed circuit board 100 by means of sockets 302 and 304, respectively. Other arrangements (with or without sockets) may be used to electrically couple the integrated circuits to print circuit 100, depending on the package type of the integrated circuits. Heat dissipation units 108 and 110 may be seen in FIG. 3 from the side. They are mounted with fasteners 306 engaged with mounting holes 109A–D and 111A–D. In a preferred embodiment, heat dissipation assemblies 108 and 110 include fan-driven heat exchangers, although other suitable heat dissipation devices such as passive heat exchangers may be used.

While the invention has been described in detail in relation to preferred embodiments thereof, the described embodiments have been presented by way of example and not by way of limitation. It will be understood by those skilled in the art that various changes may be made in the form and details of the described embodiments resulting in equivalent embodiments that will remain without the scope of the appended claims.

What is claimed is:

1. A printed circuit board, comprising:

first, second and third sets of connection points operable to be electrically connected to first, second and third integrated circuits, respectively;

wherein the connection points in said first set of connection points are arranged in a first grid pattern, said first grid pattern having a generally rectangular shape, defining a first plane and having a first center at which first orthogonal axes intersect, said first orthogonal axes coplanar with said plane orthogonal to at least one edge of said first grid pattern;

wherein the connection points in said second set of connection points are arranged in a second grid pattern, said second grid pattern having a generally rectangular shape, defining a second plane and having a second center at which second orthogonal axes intersect, said second orthogonal axes coplanar with said second plane and orthogonal to at least one edge of said grid pattern;

wherein the connection points in said third connection points are arranged in a third grid pattern, said third grid pattern having a generally rectangular shape, defining a third plane and having a third center at which third orthogonal axes intersect, said third orthogonal axes coplanar with said third plane and orthogonal to at least one edge of said third grid pattern;

wherein said first, second and third planes are parallel to one another; and wherein said second orthogonal axes are rotated counterclockwise relative to said first orthogonal axes by at least 5 degrees but not more than 25 degrees.

2. A printed circuit board according to claim 1, wherein said second orthogonal axes are rotated counterclockwise relative to said first orthogonal axes by approximately 15 degrees.

3. A printed circuit board according to claim 1, further comprising:

first and second sets of mounting holes operable to engage first and second heat dissipation assemblies, respectively, said first and second sets of mounting holes positioned relative to said first and second sets of connection points so that said first and second heat dissipation assemblies will operable to dissipate heat from said first and second integrated circuits when first and second integrated circuits and said first and second heat dissipation assemblies are installed on said printed circuit board.

4. A printed circuit board according to claim 3, wherein said second set of mounting holes is rotated relative to said first set of mounting holes by an amount chosen from the group consisting of; approximately 0 degrees, approximately 90 degrees, approximately 180 degrees, and approximately 270 degrees.

5. A printed circuit board according to claim 1, wherein said first, second and third planes are coplanar with one another.

6. A printed circuit board according to claim 1, wherein first and second centers are separated from one another by at least 2 inches but not more than 4 inches.

7. A printed circuit board according to claim 1, wherein said first and second centers are separated from one another by approximately 3 inches.

8. A printed circuit board according to claim 1, wherein said third centers is closer to said second center than it is to said first center.

9. A printed circuit board according to claim 1, wherein said first and second integrated circuits are identical, and wherein a line between said second center and the connection point that corresponds to pin 1 of said second integrated circuit is rotated clockwise about said second center by at least 65 degrees but no more than 85 degrees relative to a line between said first center and the connection point that corresponds to pin 1 of said first integrated circuit.

10. A printed circuit board according to claim 1, wherein said first and second integrated circuits are identical, and wherein a line between said second center and the connection point that corresponds to pin 1 of said second integrated circuit is rotated clockwise about said second center by approximately 75 degrees relative to a line between said first center and the connection point that corresponds to pin 1 of said first integrated circuit.

11. A printed circuit board according to claim 1, further comprising:
    a first set of conductive traces connecting a third set of signal connection points in said third set of connection points to a first set of signal connection points in said first set of connection points;
    a second set of conductive traces connecting said third set of signal connection points in said third set of connection points to a second set of signal connection points in said second set of connection points;
    wherein said first, second and third integrated circuits contains first, second and third sets of internal conductors and first, second and third dies, respectively, said first, second and third sets of internal conductors connecting said first, second and third sets of signal connection points to said, second and third dies; and
    wherein each of the conductive paths formed by said first and second sets of conductive traces and the corresponding internal conductors within said first, second and third integrated circuits has approximately the same length.

12. a printed circuit board according to claim 11, wherein each of said conductive paths is not more than approximately 2.5 inches in length.

13. A printed circuit board according to claim 11, wherein said first set of signal connection points is concentrated in the corner of said first grid pattern closer to said third center, and wherein said second set of signal connection points is concentrated in the corner of said second grid pattern closest to said third center.

14. A printed circuit board according to claim 13, wherein said third set of signal connection points is concentrated in the half of said third grid pattern closest of said first and second grid patterns.

15. A printed circuit board according to claim 1, wherein said third orthogonal axes are approximately parallel to said first orthogonal axes.

16. A printed circuit board according to claim 1, wherein said first and second integrated circuits are identical microprocessors.

17. A printed circuit board according to claim 16, wherein said third integrated circuit comprises a system chosen from the group consisting of: a bus interface system, a memory interface system, and an input/output interface system.

18. A printed circuit board according to claim 1, wherein said connection points comprise electrically conductive pads.

19. A printed circuit board according to claim 1, wherein said connection points comprise plated-through holes.

20. A printed circuit board, comprising:
    first, second and third sets of connection points operable to be electrically connected to first, second and third integrated circuits, relative;
    wherein the connection points in said first set of connection points are arrange in a first grid pattern, said first grid pattern having a generally rectangular shape, defining a first plane and having a first center at which first orthogonal axes intersect, said first orthogonal axes coplanar with said first plane and orthogonal to at least one edge of said first grid pattern;
    wherein the connection points in said second set of connection points are arranged in second grid pattern, said second grid pattern having a generally rectangular shape, defining a second plane and having a second center at which second orthogonal axes intersect, said second orthogonal axes coplanar with said second plane and orthogonal to at least one edge of said second grid pattern;
    wherein the connection points in said third set of connection points are arranged in third grid pattern, said third grid pattern having a generally rectangular shape, defining a third plane and having a third center at which third orthogonal axes intersect, said third orthogonal axes coplanar with said third plane and orthogonal to at least one edge of said third grid pattern;
    wherein said first, second and third planes are parallel to one another; and
    wherein said second orthogonal axes are rotated counter-clockwise relative to said first orthogonal axes by amount other than 0 degrees, 45 degrees, 90 degrees, 135 degrees, 180 degrees, 225 degrees, 270 degrees, and 315 degrees.

21. A printed circuit board according to claim 20, further comprising
    first and second sets of mounting holes operable to engage first and second heat dissipation assemblies, respectively, said first and second sets of mounting holes positioned relative to said first and second sets of connection points so that said first and second heat dissipation assemblies will be operable to dissipate heat from said first and second integrated circuits when said first and second integrated circuits and said first and second heat dissipation assemblies are installed on said printed circuit board.

22. A printed circuit board according to claim 21, wherein said second set of mounting holes rotated relative to said first set of mounting holes by an amount chosen from the group consisting of: approximately 0 degrees, approximately 90 degrees, approximately 180 degrees, and approximately 270 degrees.

23. A printed circuit board according to claim 20, wherein said third center is closer to said second center than it is to said first center.

24. A printed circuit board according to claim 20, further comprising:
- a first set of conductive traces connecting a third set of signal connection points in said third set of connection points to a first set of signal connection points in said first set of connection points;
- a second set of conductive traces connecting said third set of signal connection points in said third set of connection points to a second set of signal connection points in said second set of connection points;
- wherein said first, second and third integrated circuits contain first, second and third sets of internal conductors and first, second and third dies, respectively, said first, second and third sets of internal conductors connecting said first, second and third sets of signal connection points to said first, second and third dies; and
- wherein each of the conductive paths formed by said first and second sets of conductive traces and the corresponding internal conductors within said first, second and third integrated circuits has approximately the same length.

25. A printed circuit board according to claim 20, wherein said third orthogonal axes are approximately parallel to said first orthogonal axes.

26. A printed circuit board according to claim 20, wherein said first and second integrated circuits are indentical microprocessors.

27. A printed circuit board according to claim 26, wherein said third integrated circuit comprises a system chosen from the group consisting of: a bus interface system, a memory interface system, and an input/output interface system.

* * * * *

UNITED STATES PATENT AND TRADEMARK OFFICE
CERTIFICATE OF CORRECTION

PATENT NO. : 6,118,670
DATED : September 12, 2000
INVENTOR(S) : Susan K. Radford et al.

It is certified that error appears in the above-identified patent and that said Letters Patent is hereby corrected as shown below:

Column 1,
Line 6, delete "SUMMARY" and insert therefor -- FIELD --
Line 8, delete "The" and insert therefor -- This --
Line 14, delete "increase" and insert therefor -- increased --
Line 40, after "form" insert -- a --
Line 43, delete "lenghts" and insert therefor -- lengths --
Line 49, delete "arrangements" and insert therefor -- arrangement --

Column 6,
Line 29, after "plane" insert -- and --
Line 40, after "third" insert -- set of --

Column 7,
Line 16, delete "centers"and insert therefor -- center --
Line 45, delete "contains" and insert therefor -- contain --
Line 49, after "said" insert -- first --
Line 55, delete "a" and insert therefor -- A --

Signed and Sealed this

Twenty-fourth Day of December, 2002

JAMES E. ROGAN
*Director of the United States Patent and Trademark Office*